United States Patent [19]
Coon et al.

[11] Patent Number: 4,758,780
[45] Date of Patent: Jul. 19, 1988

[54] CIRCUIT BOARD TEST APPARATUS AND METHOD

[75] Inventors: Dennis R. Coon, Byesville; Richard M. Cihon, Kimbolton; Don E. Beam, Cambridge; Roy L. Hoisington, Jr., Cumberland, all of Ohio; Charles D. Adkins, Ypsilanti, Mich.

[73] Assignee: NCR Corporation, Dayton, Ohio

[21] Appl. No.: 939,504

[22] Filed: Dec. 8, 1986

[51] Int. Cl.$^4$ ............................................. G01R 1/02
[52] U.S. Cl. ........................... 324/73 PC; 324/158 F; 361/213
[58] Field of Search ............... 361/212, 213, 230, 231; 324/158 F, 73 PC

[56] References Cited

U.S. PATENT DOCUMENTS

| | | | |
|---|---|---|---|
| 4,048,667 | 9/1977 | Brennecke | 361/213 |
| 4,172,993 | 10/1979 | Leach | 324/158 F |
| 4,230,985 | 10/1980 | Matrone et al. | 324/158 F |
| 4,344,033 | 8/1982 | Stowers et al. | 324/158 F |
| 4,352,061 | 9/1982 | Matrone | 324/158 F |
| 4,417,204 | 11/1983 | Dehmel et al. | 324/73 PC |
| 4,465,972 | 8/1984 | Sokolich | 324/158 F |
| 4,477,263 | 10/1984 | Shaver et al. | 361/231 X |
| 4,507,605 | 3/1985 | Geisel | 324/73 PC |
| 4,517,512 | 5/1985 | Petrich et al. | 324/158 F X |
| 4,538,104 | 8/1985 | Douglas et al. | 324/158 F |
| 4,551,675 | 11/1985 | Heys et al. | 324/158 F |
| 4,573,009 | 2/1986 | Fowler et al. | 324/158 F |

FOREIGN PATENT DOCUMENTS 8401831  5/1984  PCT Int'l Appl. ............. 324/158 F

OTHER PUBLICATIONS

Simco: "A Full Line for Controlling Static Electricity", *Bulletin GEN*, Oct. 1985.
Simco: "Aerostat", Static Eliminators, 20 Series, *Bulletin AS*, Apr. 1985.
Simco: "Type H Air Nozzle Standard Header Mounting" Drawing and Dimensional Drawing Type HS Air Nozzle Drawing, Dec. 1972.
3M Literature: "210 Static Eliminator", 913 Air Preparation System, and 914 Air Curtain, No Date.
Electronics Test: "Testing At-Speed Keeps Boards Moving in Production, Oct. 1985, pp. 59-66.

Primary Examiner—Reinhard J. Eisenzopf
Assistant Examiner—Stephen M. Baker
Attorney, Agent, or Firm—Wilbert Hawk, Jr.; Albert L. Sessler, Jr.

[57] ABSTRACT

A circuit board test apparatus includes an interchangeable interface board adapted for use with a particular type of circuit board to be tested, a receiver board with which said interface board engages, a back plane board located generally parallel to said receiver board and containing analog and digital buses, and a plurality of analog and digital interface and controller boards mounted generally perpendicular to said receiver and said back plane boards and electrically connected thereto. The test apparatus also includes vacuum apparatus for drawing the circuit board to be tested into engagement with the interchangeable interface board and further includes several embodiments of means for directing a stream of ionized air across the circuit board to be tested to eliminate static electrical charges therefrom.

24 Claims, 7 Drawing Sheets

CIRCUIT BOARD TEST APPARATUS AND METHOD

BACKGROUND OF THE INVENTION

Because printed circuit boards are becoming more complex, and are operating at ever-increasing speeds, the equipment for testing such boards is also becoming more complex and more expensive. Developments in test equipment which provide lower costs and better techniques are therefore most useful.

Printed circuit boards are customarily tested after component assembly is completed in order to find and remove any defects, whether they are related to manufacturing (such as solder shorts, copper shorts or wrong, misplaced or missing components), or whether the components were defective when purchased.

Board testing is customarily done by probing the board at strategic testing locations. The board can be stimulated through the probe points and can also be monitored through the probe points. In the past, it has frequently been necessary to wire wrap electrical connections from the probes to a receiver panel of the tester. This is costly, and also degrades the signals that are to be monitored, which hinders the test equipment from accurately evaluating the printed circuit board under test. Another difficulty which is sometimes found in connection with the use of test equipment is the build-up of static charges, particularly in the case of vacuum-operated test apparatus, to a sufficient level to alter test results, or even damage components of the printed circuit board. Another difficulty which has been found in the past is that of distortion of test signals caused by relatively long cable runs between the board under test and portions of the test apparatus, such as driver/sensor cards located inside of the tester.

One example of an apparatus for testing printed circuit boards which employs a plurality of probe assemblies is found in U.S. Pat. No. 4,551,675, filed Dec. 19, 1983, issued Nov. 5, 1985, inventors George Heys and Dennis R. Coon, assigned to the assignee of the present application.

SUMMARY OF THE INVENTION

This invention relates to circuit board test apparatus and more particularly relates to such apparatus in which back planes and boards are arranged in a novel configuration to promote an efficient design and in which ionized air is applied to a circuit board under test to avoid static charges which could otherwise produce erroneous test results or damage to the board under test.

In accordance with a first aspect of the invention, a circuit board test apparatus comprises a personality board provided with a plurality of probe means to engage test points in a circuit board to be tested; a first back plane means provided with a plurality of probe means to engage predetermined points in the personality board, said first back plane means also being provided with a plurality of engaging means for engaging a plurality of driver-sensor boards a second back plane means parallel to and spaced from said first back plane means, provided with bus means thereon and having a plurality of engaging means for engaging a plurality of driver-sensor boards and at least one controller board means; a plurality of driver-sensor boards, positioned prependicular to said back plane means, each having a first portion engageable with said engaging means on said first back plane means and having a second portion engageable with said engaging means on said second back plane means; and at least one controller board means having a portion engageable with said engaging means of said second back plane means; whereby test commands may be conducted from said controller board through the bus means of said second back plane means to said driver-sensor boards and through said first back plane means and said personality board to a circuit being tested, and whereby the output from the board being tested is returned to said controller board means.

In accordance with a second aspect of the invention, a circuit board test apparatus comprises board receiving means for receiving a circuit board to be tested, said board receiving means having a plurality of contact means for engaging contacts on the circuit board to be tested; means for passing ionized air over the circuit board to be tested, to prevent damage to electrical components on the board to be tested and housing means on which both the board receiving means and the means for passing ionized air over the circuit board to be tested are mounted.

In accordance with a third aspect of the invention, a process for testing electrical circuit boards comprises the steps of placing a circuit board to be tested into engagement with a test fixture having interface means with a plurality of contact elements for electrically coupling said board to be tested to said test fixture; and directing a stream of ionized air from a source mounted on said fixture across the surface of the circuit board to be tested while said board to be tested is in engagement with said test fixture, in order to eliminate static charges on said board.

It is accordingly an object of the present invention to provide a circuit board test apparatus of novel and efficient design.

Another object is to provide a circuit board test apparatus capable of controlling cross talk and shielding signals in an effective manner.

Another object is to provide a circuit board test apparatus capable of minimizing the build-up of static charges on the apparatus.

Another object is to provide a circuit board test apparatus capable of minimizing speed constraints imposed because of signal degradation.

Another object is to provide a circuit board test apparatus in which wire wrap electrical connections are not required.

Another object is to provide a circuit board test apparatus which includes dual back planes to eliminate harnessing requirements.

Another object is to provide a circuit board test apparatus which includes a plurality of back plane boards and a plurality of driver-sensor boards and controller boards operatively associated with said back plane boards.

Another object is to provide a novel process for testing circuit boards.

Another object is to provide a novel process for testing circuit boards which includes directing a stream of ionized air across the surface of the circuit board to be tested.

With these and other objects, which will become apparent from the following description, in view, the invention includes certain novel features of construction and combinations of parts, a plurality of forms or embodiments of which are herein described with refer-

DETAILED DESCRIPTION

Figure 1:
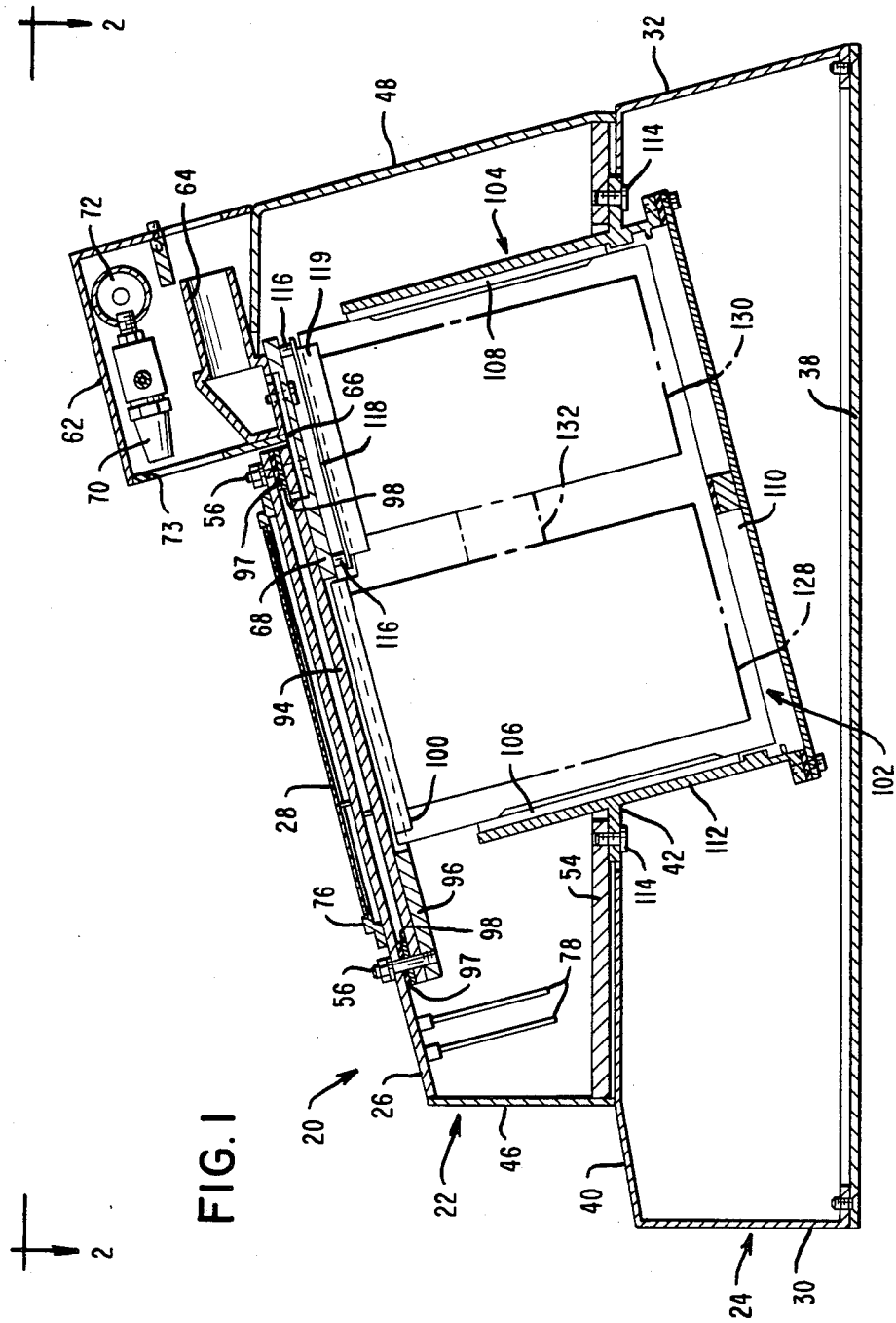
FIG. 1 is a sectional elevation view of the circuit board test apparatus of the present invention, taken along line 1—1 of FIG. 2.
Figure 2:
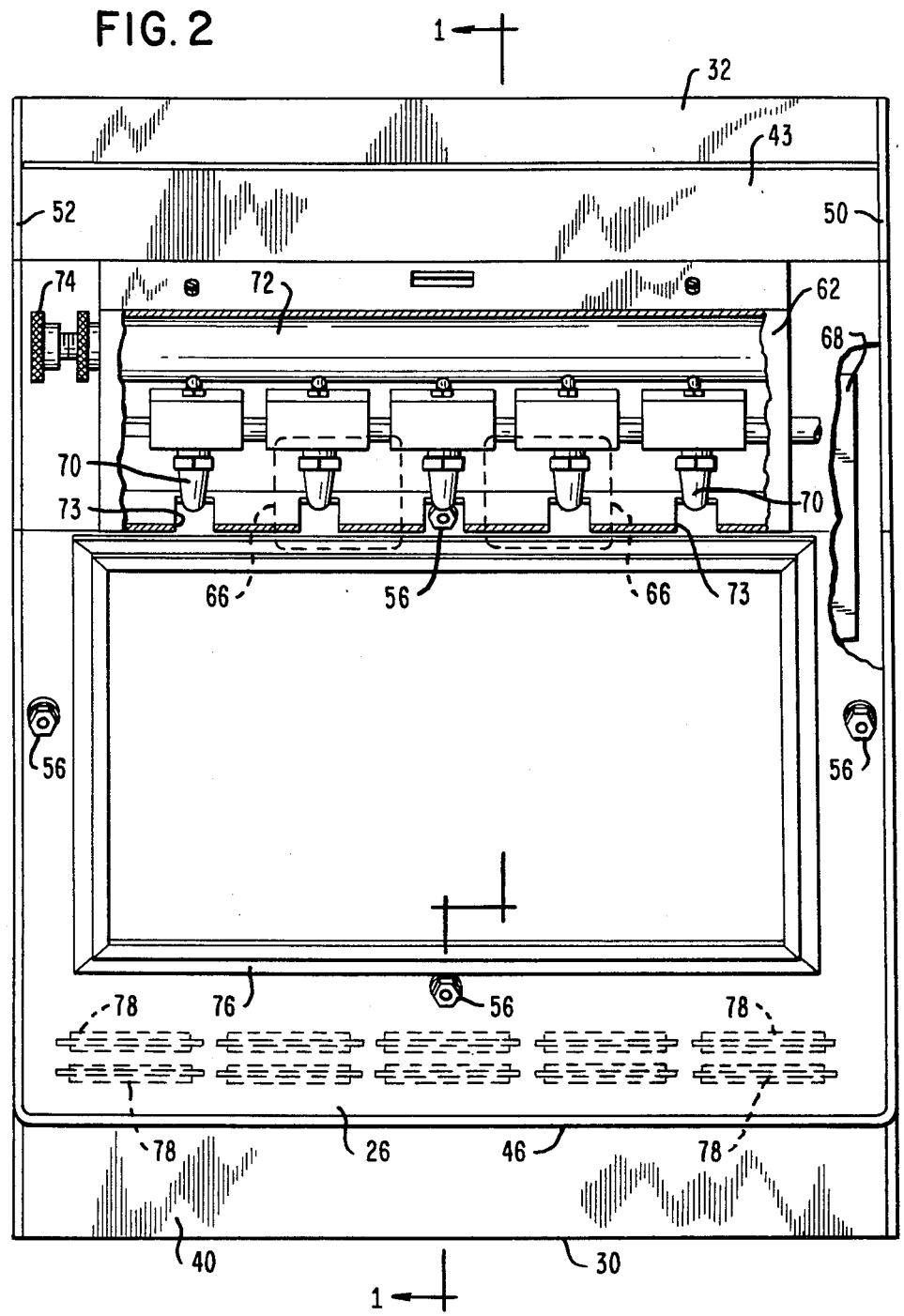
FIG. 2 is a plan view of the circuit board test apparatus taken along line 2—2 of FIG. 1.

Referring now to FIGS. 1, 2, 5 and 7, the exterior shape and general configuration of the circuit board test apparatus 20 of the present invention may be seen. As best shown in FIG. 1, the test apparatus 20 includes an upper portion 22 which rests in a base 24. An upper face or personality board 26 of the apparatus 20 is oriented at a slight angle from the horizontal in order to facilitate placement, testing and removal of a circuit board 28 which is to be tested. The personality board 26 forms part of the means by which electrical contact is obtained between the board under test 28 and the electronic circuitry of the tester, as will be subsequently described in greater detail.

The base 24 may be assembled by welding, bolting together, or any other suitable means, and includes a front panel 30, a rear panel 32, side panels 34, 36, a bottom panel 38 and an upper panel 40, which includes an aperture 42 to receive an assembly of circuit boards generally designated 102 which is suspended from the upper portion 22.

The upper portion 22 may also be assembled by welding, bolting together, or any other suitable means, and includes a front panel 46, a rear panel 48, side panels 50, 52, and a bottom panel 54, as well as the previously-mentioned upper face or personality board 26, which is removably attached to the remainder of the upper portion 24 by suitable means, such as screws 56. For each different type of circuit board 28 to be tested, a different personality board 26 is employed, to provide a suitable interface between the particular circuit configuration of the board 26 and the universal test circuitry contained in the board test apparatus 20.

A curtain 58 mounted on a roller assembly 60 which is secured to the side panel 50 may be drawn over the board 28 to be tested when said board is in position on the personality board 26 for testing. In certain cases, the curtain 58 aids in maintaining a vacuum on the board 28 from within the apparatus 20 to aid in the testing, as will subsequently be described in greater detail. A spring (not shown) within the roller assembly 60 causes the curtain 58 to be retracted when not in use.

A housing 62 is mounted above the personality board 26 and contains a vacuum connection 64 for applying a vacuum to the interior of the upper portion 22 through two apertures 66 in a rear frame member 68 which constitutes part of the inner structure of the upper portion 22.

The housing 62 may also contain a plurality of nozzles 70 secured to a tube 72 which is rotatably mounted in said housing 62, and which can be rotated by a knob 74 to adjust a stream of ionized air directed through apertures 73 by said nozzles 70 in the housing 62 over the board 28 for the purpose of eliminating static charges on said board and the components 44 thereon, which charges could otherwise affect the accuracy of the tests or damage the board 28. A source of air under pressure can be coupled to the tube 72. Each of the nozzles 70 is of a special design which ionizes the air as it passes therethrough. Ionizing nozzles of this type are available from the Simco Company, Inc., 2257 North Penn Road, Hatfield, Pa.

A number of alternative means for applying ionized air over the board 28 may also be employed.

Figure 8:
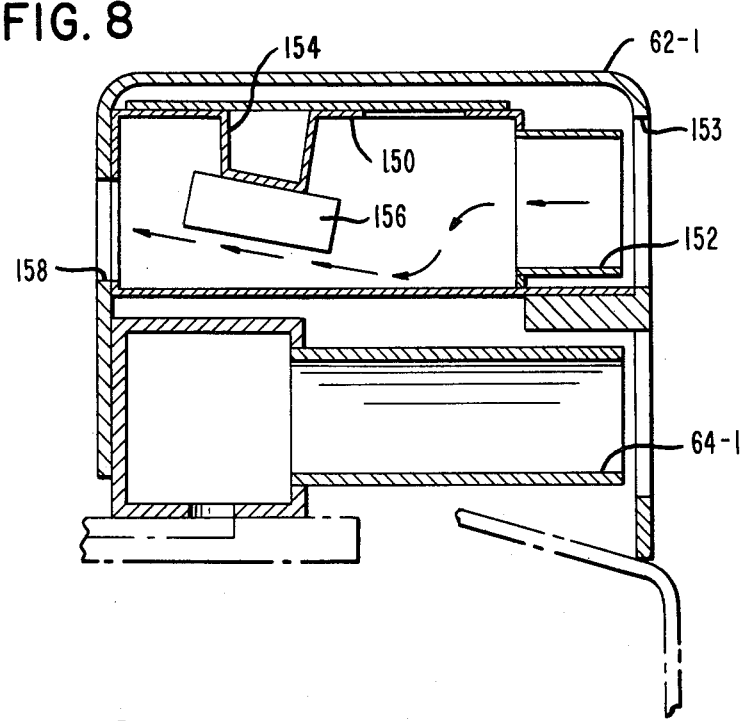
FIGS. 8, 9 and 10 are fragmentary sectional views, showing alternative embodiments of means for passing ionized air over a circuit board to be tested.

A first alternative embodiment is shown in FIG. 8, in which a housing 62-1 contains a vacuum connection 64-1, above which is mounted an air chamber 150 extending the length of the housing 62-1. The chamber 150 is connected by means of a connector 152 to a remote source (not shown) of air under pressure of 45 to 65 cubic feet per minute from a fan or blower, through an aperture 153 in the housing 62-1. Mounted within the chamber 150 by means of a bracket 154 is a nuclear static eliminator 156 in the form of a bar extending substantially the length of the chamber 150. The static eliminator 156 applies a static charge to air which moves past it under pressure from the connector 152 through the chamber 150 and out through one or more apertures 158 to pass over the board 28 being tested. The static eliminator 156 contains the isotope P0-210 and emits alpha radiation. It has a normal useful life of one year, after which it must be replaced. Static eliminators of this type are available from 3M Company, St. Paul, Minn.

Figure 9:
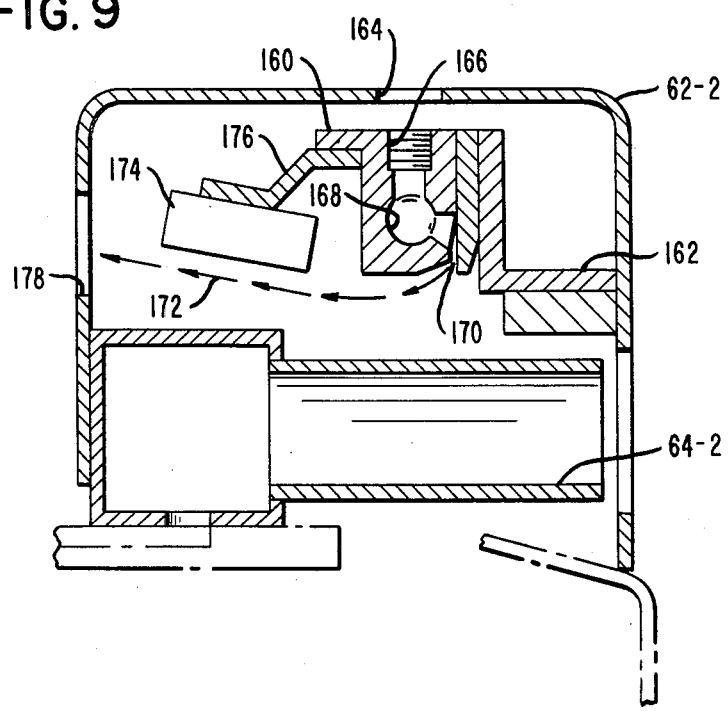

A second alternative embodiment is shown in FIG. 9, in which a housing 62-2 contains a vacuum connection 64-2. An elongated air curtain element 160 is mounted above the vacuum connection 64-2 by means of a bracket 162 attached to the housing 62-2. An aperture 164 in the housing 62-2 is provided for connection of the air curtain element 160 to an air compressor (not shown) via a hose or other coupling (not shown). The element 160 includes a threaded aperture 166 for reception of the hose or other coupling member through which filtered compressed air passes, a plenum chamber 168, and a narrow air slot 170 which may be of 2-mil width, so that the compressed air stream exits the slot at high velocity. The high-velocity air entrains ambient air, so that the volume of air which is moved by the air curtain element 160 can be as high as twenty times greater than the volume of compressed air entering the element 160. As shown by the arrows 172, the air stream passes from the slot 170, under a static eliminator 174 attached by a bracket 176 to the air curtain element 160, and out of the housing 62-2 through an aperture 178 to flow over a board 28 under test. The static eliminator 174 may be of the same type as the static eliminator 156 of the embodiment of FIG. 8. A model 914 air curtain element is available from 3M Company, St. Paul, Minn., and a suitable air compressor is also available from 3M Company as the 913 air preparation system.

Figure 10:
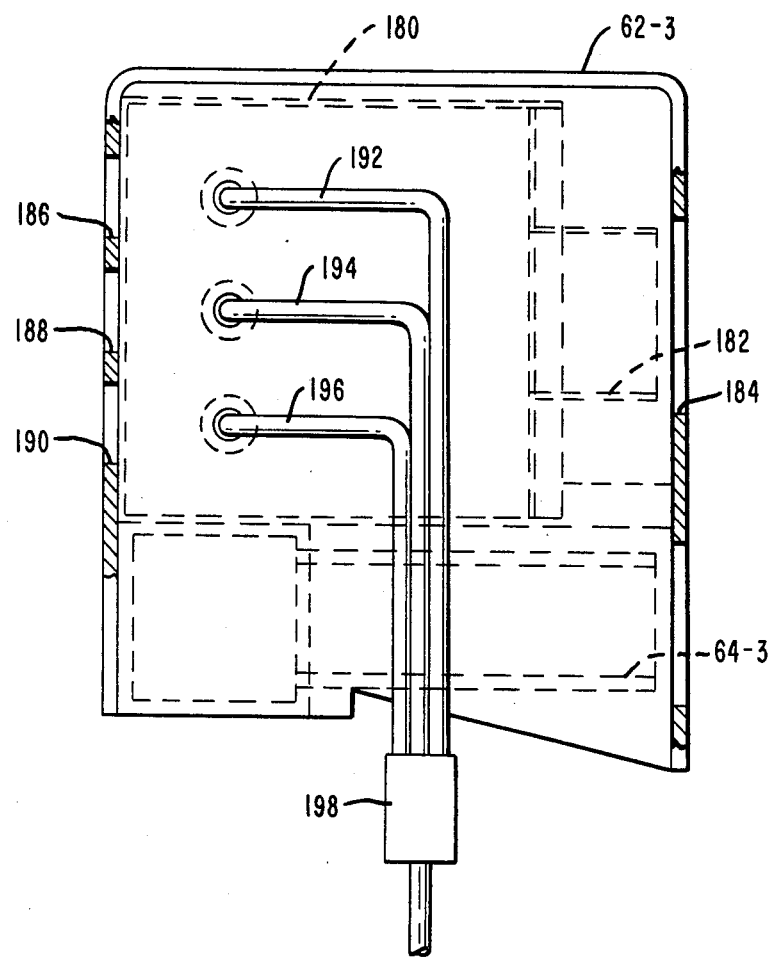

A third alternative embodiment is shown in the enlarged view of FIG. 10, in which a housing 62-3 contains a vacuum connection 64-3, above which is mounted an air chamber 180 extending the length of the housing 62-3. The chamber 180 is connected by means of a connector 182 to a remote source (not shown) of air under pressure of 45 to 65 cubic feet per minute from a fan or blower, through an aperture 184 in the housing 62-3. Apertures such as the apertures 186, 188 and 190, which may be of elongated, circular or other form, in the housing 62-3, permit the egress of air from the chamber 180 under pressure, which air can then pass over a board 28 under test. Positioned within the chamber 180 are a plurality of static neutralizing bars 192, 194 and 196 powered by a remote mounted compact high voltage power supply (not shown) which is connected to the bars 192, 194 and 196 by a connector 198. Each of the bars 192, 194 and 196 extends longitudinally of the housing 62-3. Metallic ionizing points (not shown) on the bars are capacitively coupled to the power supply and produce ionization in th air passing through the chamber 180. Devices of this type are available from the SIMCO Company, Inc., Hatfield, Pa.

As previously indicated, the personality board 26 forms part of the means by which electrical contact is obtained between test points on the board 28 under test and the electronic test circuitry of the test apparatus 20. As may best be seen in FIGS. 1, 2 and 3, mounted on the board 26 is a rectangular framelike seal 76, which is fabricated, as by molding, from a suitable resilient material such as rubber, and which is dimensioned to receive precisely a board 28 for testing.

Also mounted on the board 26 and extending inwardly therefrom into the interior of the upper portion 22 of the test apparatus 20 are a plurality of interface circuit boards 78 which are associated with the particular type of board 28 with which a given personality board 26 is associated. The boards 78 provide the necessary interface electronic circuitry to adapt the universal circuitry of the test apparatus 28 to test the particular board 28 being tested.

Figure 3:
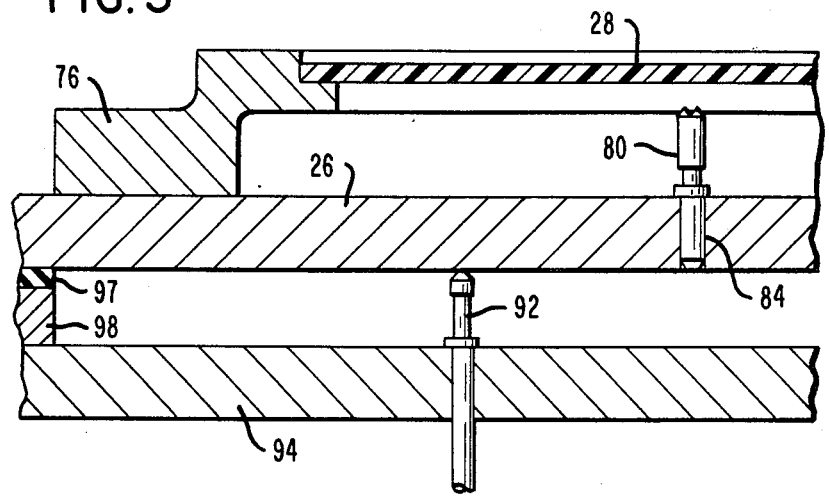
FIG. 3 is an enlarged fragmentary sectional view, showing detailed construction of the receiver board, the personality board, and the board under test, together with the associated probe assemblies.
Figure 6:
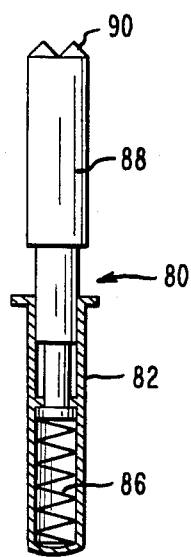
FIG. 6 is a detail view, partially in section, of a probe.
Figure 7:
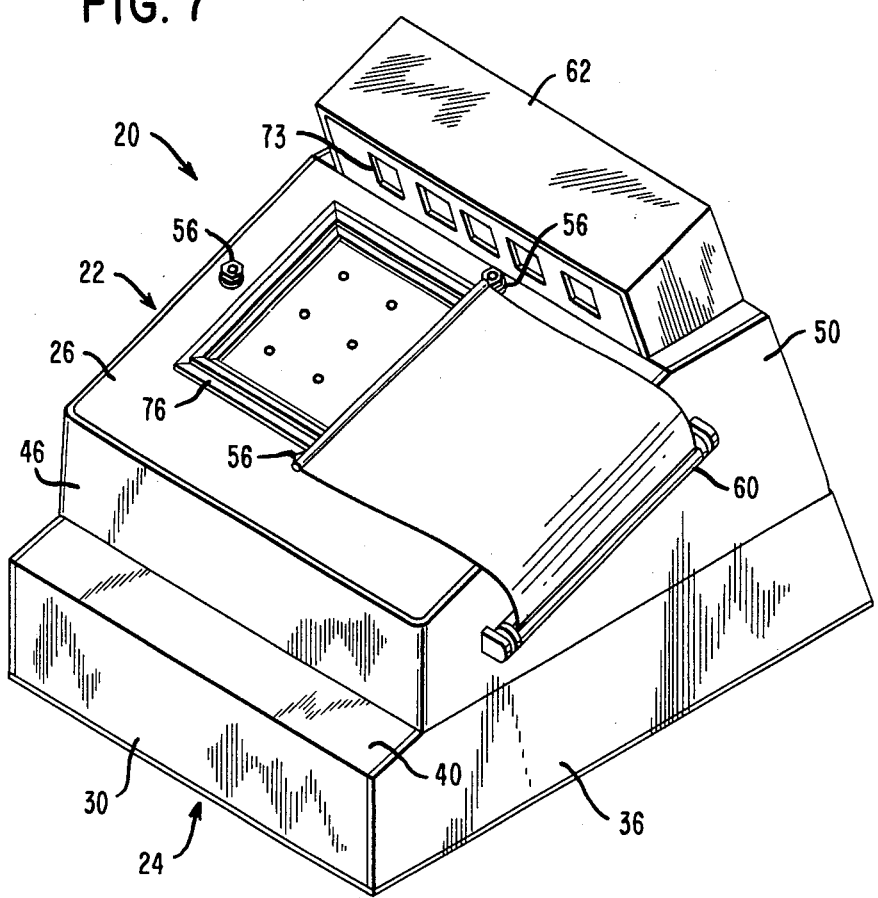
FIG. 7 is a right perspective view of the exterior of the circuit test apparatus.

As shown in FIG. 3, a plurality of first probes 80 are mounted in the personality board 26. A sleeve 82 (FIG. 6) of each probe 80 is positioned in a suitably located bore 84 in the personality board 26. A spring 86 urges the probe body 88 upwardly to move the probe tip 90 to its uppermost position. The tip 90 of the probe 80 is normally spaced from a predetermined test point of the board 28 under test. However when a vacuum is applied to the interior of the test apparatus 20 via the vacuum connection 64, the seal 76 will flex and the board 28 which is under test will move downwardly so that the probe tips 90 of the probes 80 will engage predetermined test points of the board 28 under test in accordance with the configuration of the personality board 26.

Figure 4:
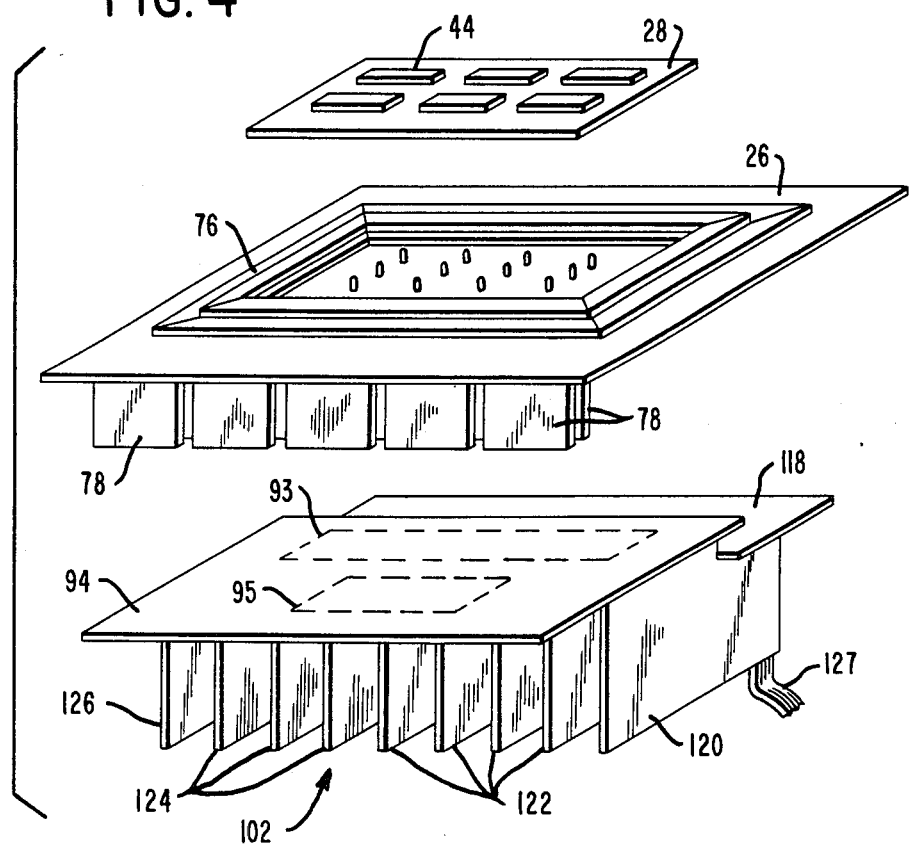
FIG. 4 is an exploded perspective view of the circuit board test apparatus.
Figure 5:
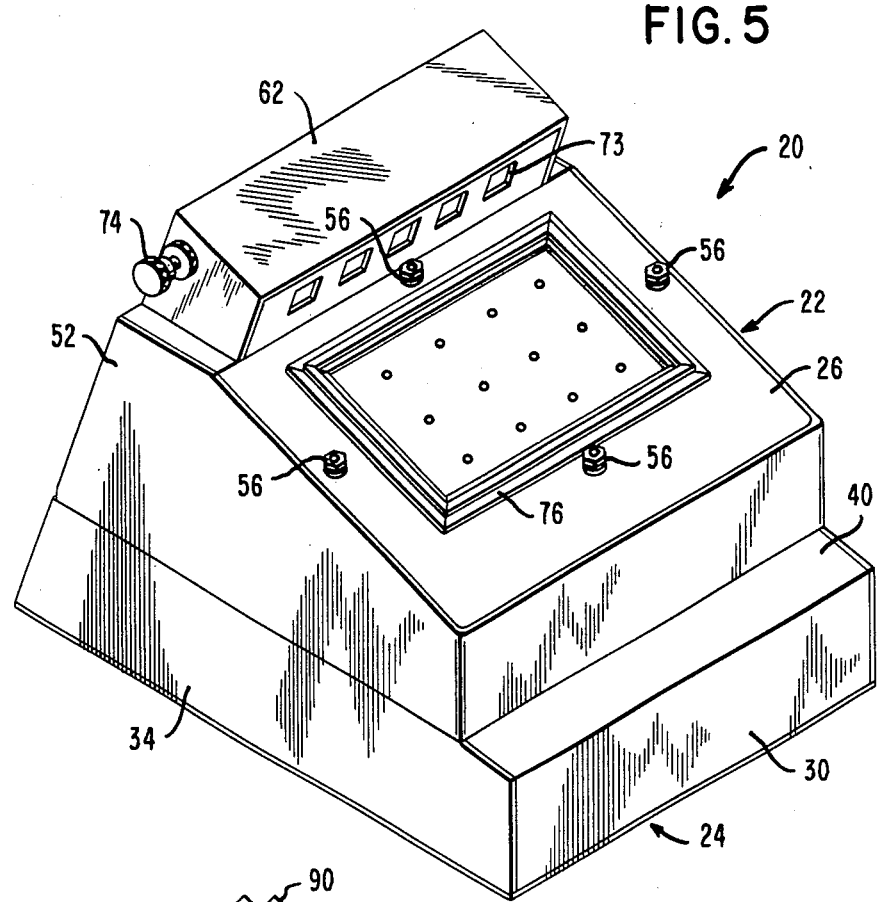
FIG. 5 is a left perspective view of the exterior of the circuit board test apparatus.

The sleeve 82 of each probe 80 is electrically connected by suitable plating or other means on the lower surface of the personality board 26 to a location on said lower surface which is engageable with a second probe 92 positioned in a receiver board 94 which is permanently fixed in, and forms a part of, the test apparatus 20. The probe 92, which may be of spring-urged construction similar to the probe 80, thus provides further coupling means connecting electrical test points on the board 28 under test to the electronic test circuitry of the test apparatus 20. The receiver board 94 is supported within the upper portion 22 of the test apparatus 20 by the rear frame member 68 and a front frame member 96. Spacer elements 98, each having a resilient upper portion 97, which are fixed on the receiver board 94, support the personality board 26 and are apertured and threaded to receive the screws 56. The area of the receiver board 94 containing the probes 92 is represented in the perspective view of FIG. 4 by the dashed outline 93, while a second dashed outline 95 represents a second area where similar probes may be employed for connection to power and utility facilities on the board 28 under test.

A plurality of circuit board connectors 100 are fixed to the lower surface of the receiver board 94 in parallel alignment for electrically coupling a plurality of circuit boards, generally designated 102, to the receiver board 94. The boards 102 are positioned in planes perpendicular to the board 94, as may be seen in the exploded diagrammatic perspective view of FIG. 4, and are supported in a frame 104 which comprises front, rear and base support members 106, 108 and 110 which are in turn supported in a frame 112 secured to the bottom panel 54 of the upper portion 22 of the test apparatus 20 by suitable fastening means such as screws 114.

Secured to the rear frame 68 by spacers 116 is a back plane board 118. A plurality of circuit board connectors 119 are secured to the lower surface of the board 118 and provide electrical connections between said board 118 and the vertically oriented circuit boards generally designated 102. The electrically connected combination of receiver board 94, back plane board 118 and vertical circuit boards 102 provides a compact, efficient electronic test system which can be readily modified to meet changing conditions or requirements by replacement of various boards as appropriate. In this compact structure, test signals can be in closer proximity to where they are needed, and therefore can be of higher frequency. In addition, the need for wire wrap connections and cabling is eliminated, thus simplifying assembly and lowering labor costs.

The receiver board 94 provides an interface between the rest of the system and the board 28 being tested, as previously described. The back plane board 118 provides both digital and analog buses for interconnecting the various vertically oriented cards 102 on which the control and testing functions are implemented. In one embodiment of the test apparatus, the vertically oriented boards may include a digital controller board 120, a plurality of digital interface boards 122, a plurality of analog interface boards 124, and an analog controller board 126. The controller boards 120 and 126 are normally cabled to the actual processor or controller which runs apparatus 20 by means of suitable cabling 127, such as an IEEE 488 interface cable. Each of the digital and analog interface boards 122 and 124 has two separate functional sections, one of which, represented by dashed outline 128 (FIG. 1), comprises driver-sensor circuits and is coupled to the receiver board 94 via connectors 100, and one of which, represented by dashed outline 130, comprises satellite controller functions and is coupled to the analog or digital bus of the back plane board 118 via the connectors 119. The driver-sensor section 128 of each such board 122 or 124 is electrically connected on the board by conductors represented by dashed outline 132 to its corresponding satellite function section 130 and is controlled thereby. It will be seen that the analog interface boards 124 are connected to the analog bus on the back plane board 118 which in turn is connected to the analog controller board 126, and that the digital interface boards 122 are connected to the digital bus on the back plane board 118 which in turn is connected to the digital controller board 120. There is normally no communication between the analog interface boards 124 and the digital interface boards 122, though such could be provided through additional boards, if desirable for some reason.

The digital circuitry contained in the digital interface boards 122 is commonly emulation circuitry, which performs the function of emulating various devices such as microprocessors, memories, peripheral equipment, etc., and provides pattern capture capability.

The analog circuitry contained in the analog interface boards 124 commonly provides buffering for analog signals and provides switching and other monitoring functions.

Digital test signals are commonly generated in an external processing system (not shown) and are transmitted through the cable 127 to the digital controller board 120, through the digital bus on the back plane board 118, through the satellite section 130 on a board 122 and the conductors 132 to the driver-sensor section 128 on the board 122. This section is connected via connectors 100 to the receiver board 94. Probes 92 on the board 94 engage areas on the personality board 26 which are electrically coupled to probes 80 on the board 26, which in turn engage test points on the board 28 to be tested. A reverse return path carries the signal developed by the board 28 back to the external processing system for analysis.

When a board 28 is to be tested, it is placed in the seal 76 on the personality board 26. A stream of ionized air may then be directed through the nozzles 70 or through the apertures in the housing 62-1, 62-2 or 62-3 of FIGS. 8, 9 and 10, onto the board in order to eliminate static charges on the board which could otherwise damage it or render the test results inaccurate. In the embodiment of FIG. 1, the path of the ionized air stream may be adjusted by turning the knob 74, which rotates the tube 72 in which the nozzles 70 are fixed.

The board 28 to be tested is next brought into firm electrical engagement with the probes 80 of the personality board 26 by applying vacuum to board 28 through the vacuum connection 64. If there are openings in the board 28, this is done most effectively by bringing the curtain 58 across the board 28 and then applying the vacuum. In applications where only boards having no openings are to be tested, the curtain 58 and associated structure may be omitted.

The actual electronic testing may then be carried on as described above. When such testing is concluded, the vacuum is turned off, the curtain 58 is retracted into its roll 60, and the tested board 28 is removed from the seal 76 on the personality board 26. When it is desired to test a different type of board 28, the previously used personality board 26 is removed by loosening the fasteners 56 and is replaced by a new personality board 26 of appropriate design.

While the forms of the invention shown and described herein are admirably adapted to fulfill the objects primarily stated, it is to be understood that it is not intended to confine the invention to the forms or embodiments disclosed herein, for it is susceptible of embodiment in various other forms within the scope of the appended claims.

What is claimed is:

1. A circuit board test apparatus comprising:

A personality board provided with a plurality of probe means to engage test points in a circuit board to be tested;

a first back plane means provided with a plurality of probe means to engage predetermined points in the personality board, said first back plane means also being provided with a plurality of engaging means for engaging a plurality of driver-sensor boards;

a second back plane means parallel to and spaced from said first back plane means provided with bus means thereon and having a plurality of engaging means for engaging a plurality of driver-sensor boards and at least one controller board means;

a plurality of driver-sensor boards, positioned perpendicular to said first and second back plane means, each having a first portion engageable with said engaging means on said first back plane means and having a second portion engageable with said engaging means on said second back plane means; and at least one controller board means having a portion engageable with said engaging means of said second back plane means;

whereby test commands may be conducted from said controller board through the bus means of said second back plane means to said driver-sensor boards and through said first back plane means and said personality board to a circuit being tested, and whereby the output from the board being tested is returned to said controller board means.

2. The circuit board test apparatus of claim 1 in which each driver-sensor board includes a driver-sensor section which is coupled to the first back plane means, a bus section which is coupled to the second back plane means, and a communications section coupling the bus section and the driver-sensor section.

3. The circuit board test apparatus of claim 1, in which at least one controller board means and at least certain of the driver-sensor boards employ digital circuitry, and in which the bus means of the second back plane means includes a digital bus.

4. The circuit board test apparatus of claim 1, in which at least one controller board means and at least certain of the driver-sensor circuit boards employ analog circuitry, and in which the bus means of the second back plane means includes an analog bus.

5. The circuit board test apparatus of claim 1, also including means operatively coupled to said apparatus for passing ionized air over a circuit board to be tested.

6. The circuit board test apparatus of claim 5, in which said means for passing ionized air includes compressed air means and at least one nozzle coupled to said compressed air means and capable of ionizing th air passing therethrough.

7. The circuit board test apparatus of claim 5 in which said means for passing ionized air includes compressed air means and a plurality of nozzles coupled to said compressed air means and capable of ionizing the air passing therethrough, said nozzles being interconnected for unitary movement and being movable to adjust the flow of ionized air over the circuit board to be tested.

8. The circuit board test apparatus of claim 5, in which said means for passing ionized air includes a nuclear static eliminator and means for passing air under pressure past said nuclear static eliminator.

9. The circuit board test apparatus of claim 8, in which said means for passing air under pressure includes a plenum chamber having a restricted slot exit.

10. The circuit board test apparatus of claim 5, in which said means for passing ionized air includes a plurality of elongated ionizing bars and means for passing air under pressure past said bars.

11. The circuit board test apparatus of claim 1, also including resilient seal means secured to said personality board for receiving the circuit board to be tested.

12. A circuit board test apparatus comprising:
a personality board provided with a plurality of probe pins to engage test points in a circuit board to be tested;
a first back plane provided with a plurality of probe pins to engage predetermined points in the personality board, said first back plane also having a plurality of engaging means for engaging a plurality of boards which are disposed at an angle to said first back plane when engaged;
a second back plane having a plurality of engaging means for engaging a plurality of boards which are disposed at an angle to said second back plane when engaged, said second back plane embodying digital and analog bus means;
a plurality of analog driver-sensor boards each having a first portion engageable with said engaging means on said first back plane and a second portion engageable with said engaging means on said second back plane;
a plurality of digital driver-sensor boards each having a first portion engageable with said engaging means on said first back plane and a second portion engageable with said engaging means on said second back plane;
at least one digital controller board having a first portion engageable with said means on said second back plane; and
at least one analog controller board having a first portion engageable with said engaging means on said second back plane;
whereby digital and analog test commands may be conducted from said digital and analog controller boards through the digital and analog buses in said second back plane to said respective digital and analog driver sensor boards to cause appropriate test signals to be applied through said first back plane and said personality board to a circuit board being tested, and whereby the output from said board being tested is returned through said personality board, said first back plane, said driver-sensor boards, and said buses in said second back plane, to said digital and analog controller boards, for use in analysis of the board being tested.

13. A circuit board test apparatus comprising:
board receiving means for receiving a circuit board to be tested, said board receiving means having a plurality of contact means for engaging contacts on the circuit board to be tested;
means for passing ionized air over the circuit board to be tested; to prevent damage to electrical components on the board to be tested; and
housing means on which both the board receiving means and the means for passing ionized air over the circuit board to be tested are mounted.

14. The circuit board test apparatus of claim 13, in which said means for passing ionized air includes compressed air means and at least one nozzle coupled to said compressed air means and capable of ionizing the air passing therethrough.

15. The circuit board test apparatus of claim 13 in which said means for passing ionized air includes compressed air means and a plurality of nozzles coupled to said compressed air means and capable of ionizing the air passing therethrough, said nozzles being interconnected for unitary movement and being movable to adjust the flow of ionized air over the circuit board to be tested.

16. The circuit board test apparatus of claim 15 in which said nozzles each have built-in ionizing means.

17. The circuit board test apparatus of claim 13, in which said means for passing ionized air includes a nuclear static eliminator and means for passing air under pressure past said nuclear static eliminator.

18. The circuit board test ap.apratus of claim 17, in which said means for passing air under pressure includes a plenum chamber having a restricted slot exit.

19. The circuit board test apparatus of claim 11, in which said means for passing ionized air includes a plurality of elongated ionizing bars and means for passing air underpressure past said bars.

20. A process for testing electrical circuit boards comprising the following steps:
(a) placing a circuit board to be tested into engagment with a test fixture having interface means with a plurality of contact elements for electrically coupling said board to be tested to said test fixture, and
(b) directing a stream of ionized air from a source mounted on said fixture across the surface of the circuit board to be tested while said board to be tested is in engagement with said test fixture in order to eliminate stateic charges on said board.

21. The process of claim 20, also including the step of applying vacuum pressure to said circuit board under test to bring it into engagement with said test fixture.

22. The process of claim 20, in which step (b) includes adjusting the angle at which the stream of ionized air is directed across the surface of the circuit board in order to achieve maximum effect.

23. The process of claim 21, also including the step of placing a curtain across the board to be tested before said vacuum pressure is applied to said board and including the step of removing the curtain from the board to be tested after said board has been brought into engagement with said test fixture and before said stream of ionized air is directed across the surface of the circuit board to be tested.

24. The process of claim 20, also including the step of substituting one interface means for another in order to test different types of circuit boards.

* * * * *

UNITED STATES PATENT AND TRADEMARK OFFICE
CERTIFICATE OF CORRECTION

PATENT NO.  : 4,758,780
DATED       : July 19, 1988
INVENTOR(S) : Dennis R. Coon et al.

It is certified that error appears in the above-identified patent and that said Letters Patent is hereby corrected as shown below:

Column 8, line 1, delete "A" and substitute --a--.

Column 8, line 52, delete "th" and substitute --the--.

Column 10, line 23, delete "ap.apratus" and substitute --apparatus--.

Column 10, line 29, delete "underpressure" and substitute --under pressure--.

Column 10, line 32, delete "engagment" and substitute --engagement--.

Column 10, line 40, delete "stateic" and substitute --static--.

Signed and Sealed this

Fifteenth Day of November, 1988

*Attest:*

DONALD J. QUIGG

*Attesting Officer*    *Commissioner of Patents and Trademarks*